(12) United States Patent
Geng et al.

(10) Patent No.: US 12,279,395 B2
(45) Date of Patent: Apr. 15, 2025

(54) PATTERNED BOLSTER PLATE AND COMPOSITE BACK PLATE FOR SEMICONDUCTOR CHIP LGA PACKAGE AND COOLING ASSEMBLY RETENTION

(71) Applicant: Intel Corporation, Santa Clara, CA (US)

(72) Inventors: Phil Geng, Washougal, WA (US); Ralph V. Miele, Hillsboro, OR (US); David Shia, Portland, OR (US); Jeffory L. Smalley, Olympia, WA (US); Eric W. Buddrius, Hillsboro, OR (US); Sean T. Sivapalan, Portland, OR (US); Olaotan Elenitoba-Johnson, Tigard, OR (US); Mengqi Liu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 584 days.

(21) Appl. No.: 17/474,974

(22) Filed: Sep. 14, 2021

(65) Prior Publication Data

US 2021/0410317 A1 Dec. 30, 2021

(51) Int. Cl.
*H05K 7/14* (2006.01)
*H01L 23/053* (2006.01)
(Continued)

(52) U.S. Cl.
CPC ......... *H05K 7/1489* (2013.01); *H01L 23/053* (2013.01); *H01L 23/32* (2013.01); *H01L 23/40* (2013.01)

(58) Field of Classification Search
CPC .. H05K 7/1431; H05K 7/1489; H05K 7/2039; H05K 7/20409; H05K 7/20509;
(Continued)

(56) References Cited

U.S. PATENT DOCUMENTS

2003/0019097 A1 1/2003 White
2004/0084764 A1 5/2004 Ishimine et al.
(Continued)

FOREIGN PATENT DOCUMENTS

GB 2576032 4/2021
GB 2576030 12/2021
(Continued)

OTHER PUBLICATIONS

International Searching Authority, "International Search Report and Written Opinion," issued Nov. 1, 2022 in connection with International Patent Application No. PCT/US2022/035582, 11 pages.
(Continued)

*Primary Examiner* — Amir A Jalali
(74) *Attorney, Agent, or Firm* — Hanley, Flight & Zimmerman, LLC

(57) ABSTRACT

An apparatus is described. The apparatus includes a back plate, where, an electronic circuit board is to be placed between the back plate and a thermal cooling mass for a semiconductor chip package. The back plate includes a first material and a second material. The first material has greater stiffness than the second material. The back plate further includes at least one of: a third material having greater stiffness than the second material; re-enforcement wires composed of the first material; a plug composed of the second material that is inserted into a first cavity in the first material, a stud inserted into a second cavity in the plug. An improved bolster plate having inner support arms has also been described.

14 Claims, 16 Drawing Sheets

(51) Int. Cl.
   *H01L 23/32* (2006.01)
   *H01L 23/40* (2006.01)

(58) Field of Classification Search
   CPC .......... H05K 7/20709; H05K 7/20727; H05K 1/0203; H05K 1/9371; H05K 1/18; H05K 1/181; H05K 2201/066; H05K 2201/10598; H05K 2201/10734; H05K 2201/2009; H05K 2201/2018; H01L 23/053; H01L 23/32; H01L 23/367; H01L 23/3675; H01L 23/40; H01L 23/4006; H01L 23/4093; H01L 21/56; H01L 21/4882; H01L 2023/405; H01L 2023/4081; H01L 2023/4087; G06F 1/20
   See application file for complete search history.

(56) References Cited

U.S. PATENT DOCUMENTS

| | | | |
|---|---|---|---|
| 2016/0079150 A1 | 3/2016 | Chawla et al. | |
| 2016/0183375 A1* | 6/2016 | Krithivasan | H01L 23/36 |
| | | | 257/713 |
| 2019/0306985 A1* | 10/2019 | Ferguson | H01R 12/88 |
| 2019/0393631 A1* | 12/2019 | Haswarey | G06F 1/20 |
| 2020/0101570 A1* | 4/2020 | Potter | G06F 1/203 |
| 2020/0411410 A1* | 12/2020 | Klein | H01L 23/427 |
| 2021/0183737 A1* | 6/2021 | Smalley | H01L 23/49551 |
| 2021/0193558 A1* | 6/2021 | Miele | H05K 7/20709 |
| 2021/0320050 A1 | 10/2021 | Robinson et al. | |
| 2021/0327787 A1 | 10/2021 | Yang et al. | |

FOREIGN PATENT DOCUMENTS

| | | |
|---|---|---|
| GB | 2597525 | 2/2022 |
| GB | 2601357 | 6/2022 |
| KR | 20020059160 A | 7/2002 |
| KR | 100666919 B1 | 1/2007 |

OTHER PUBLICATIONS

International Searching Authority, "International Preliminary Report on Patentability," issued in connection with International Patent Application No. PCT/US2022/035582, mailed on Mar. 28, 2024, 7 pages.

* cited by examiner

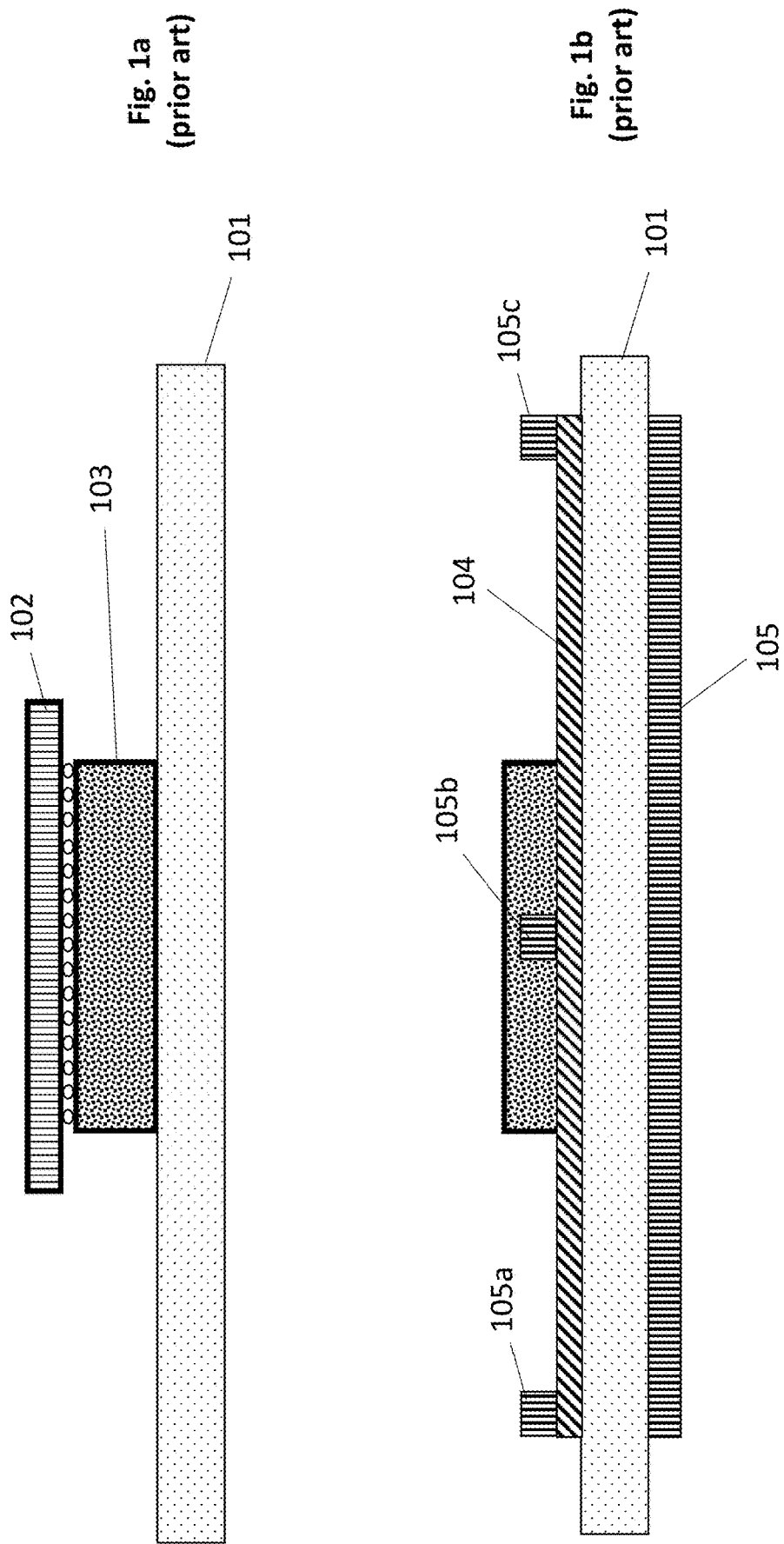

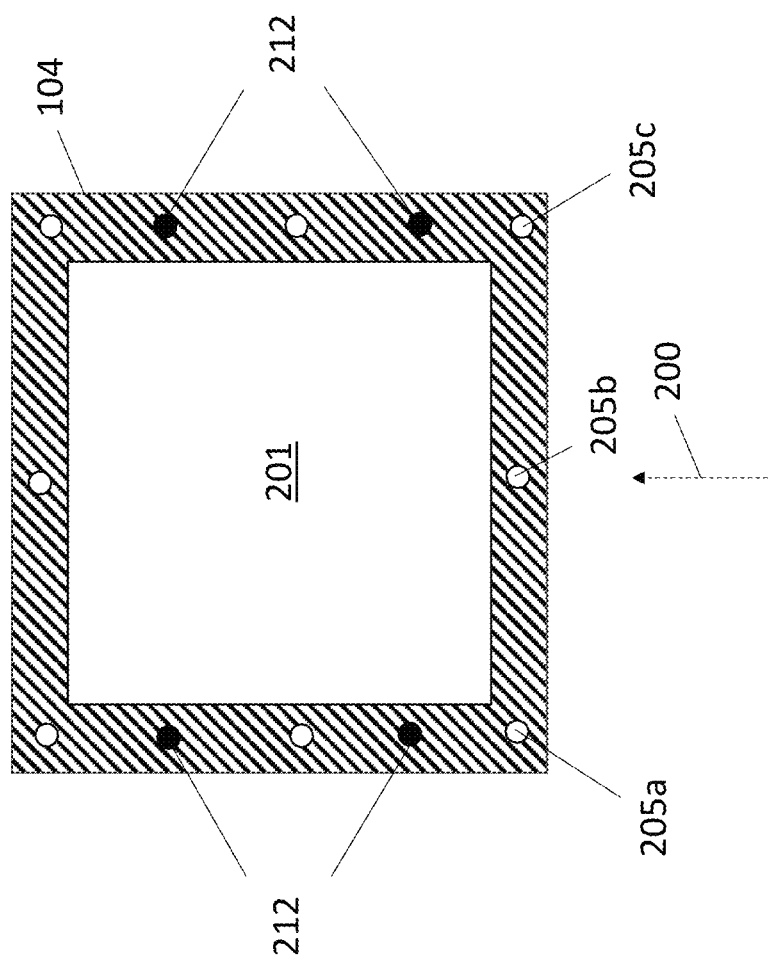

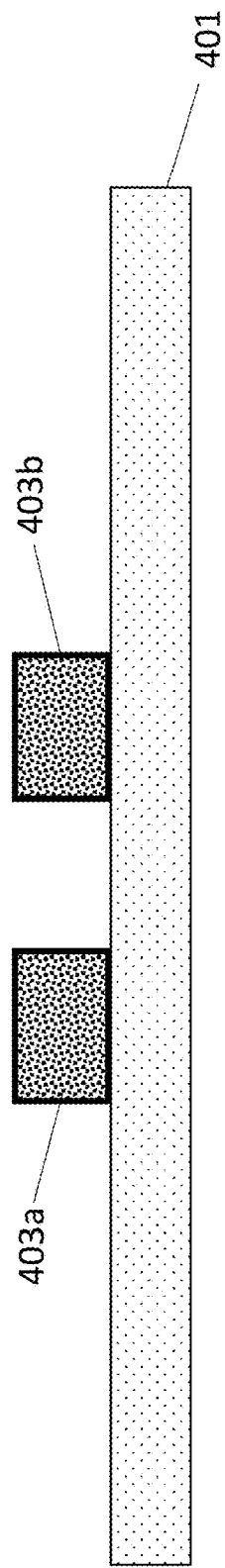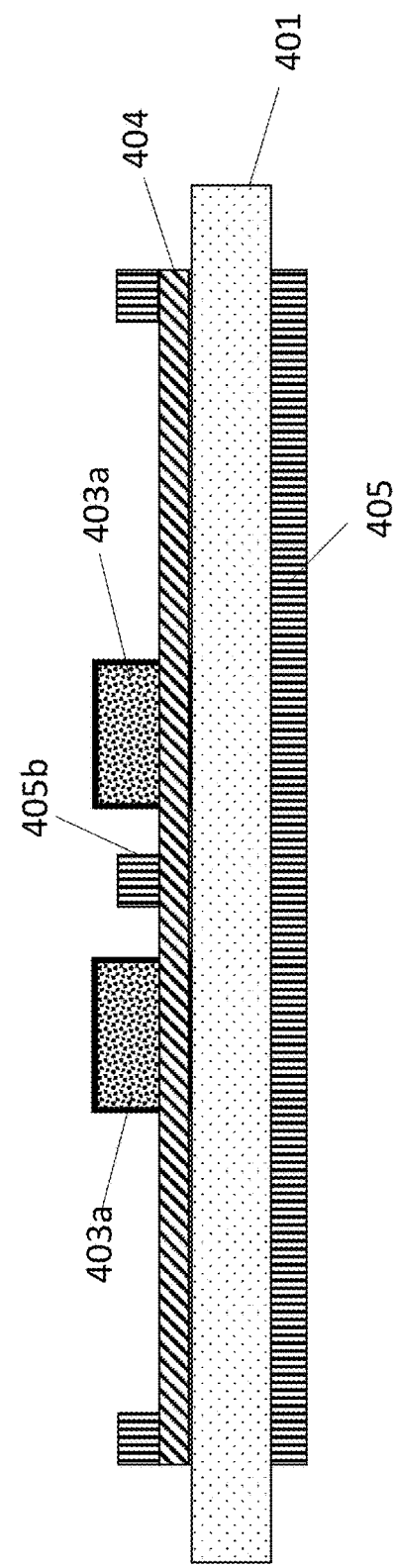

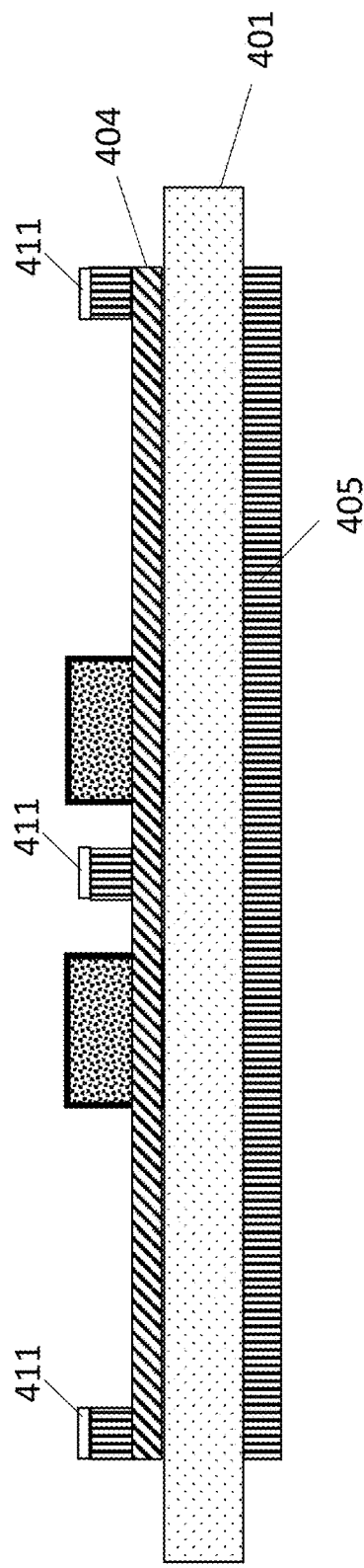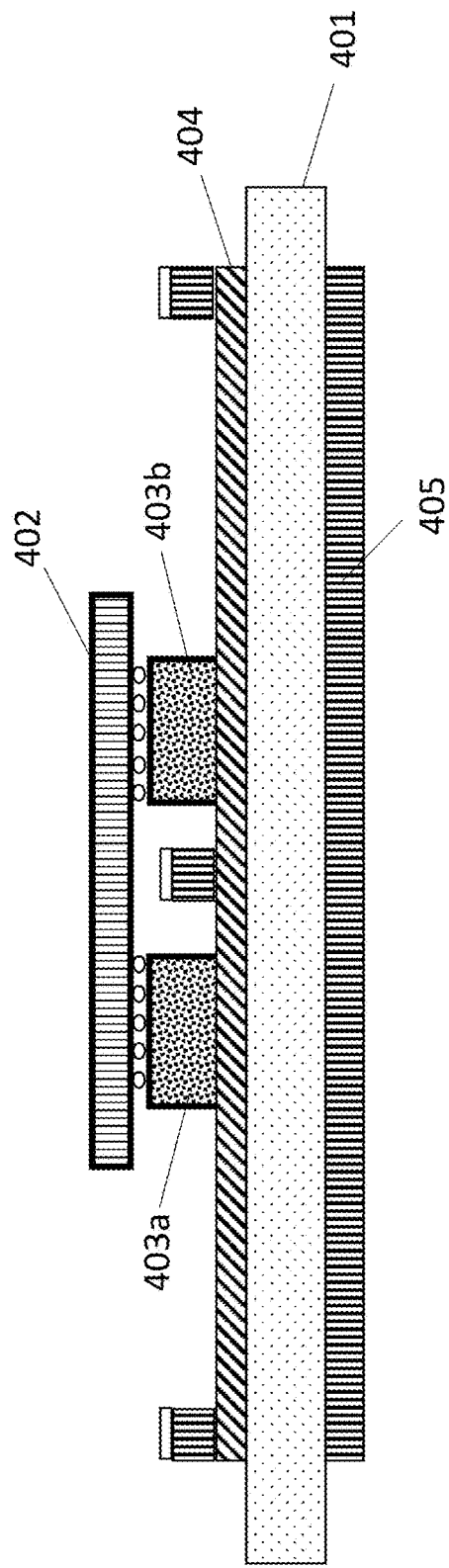

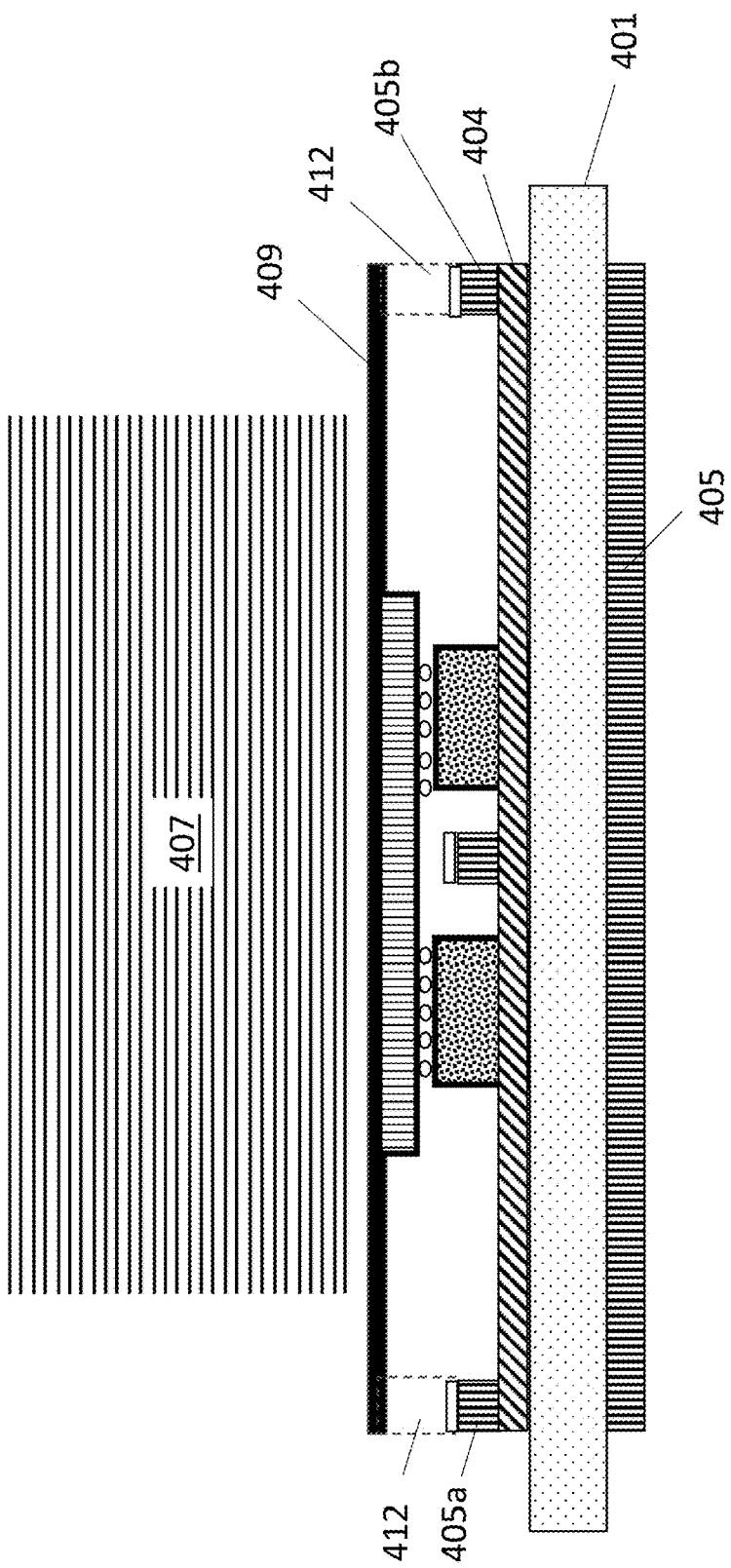

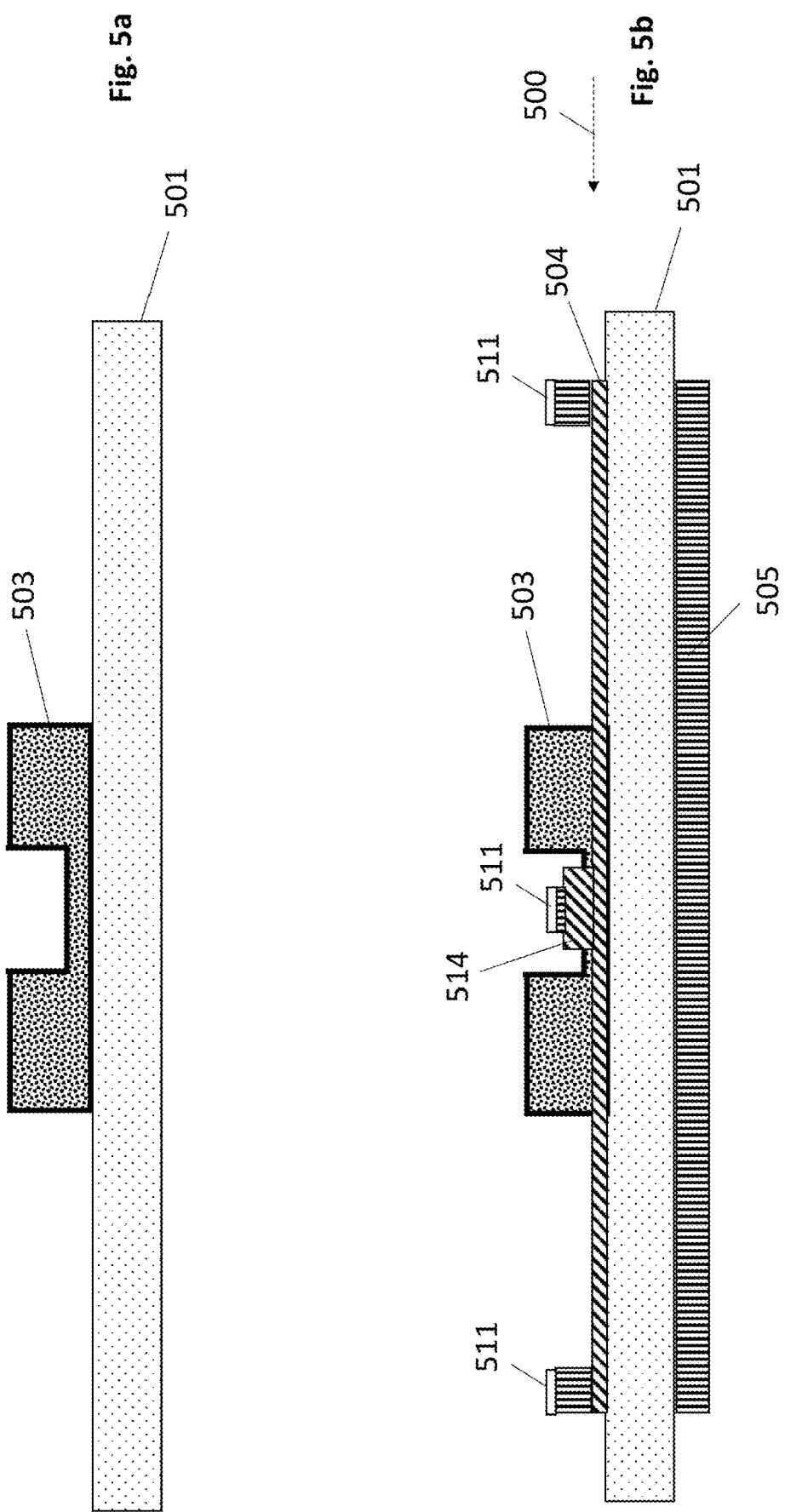

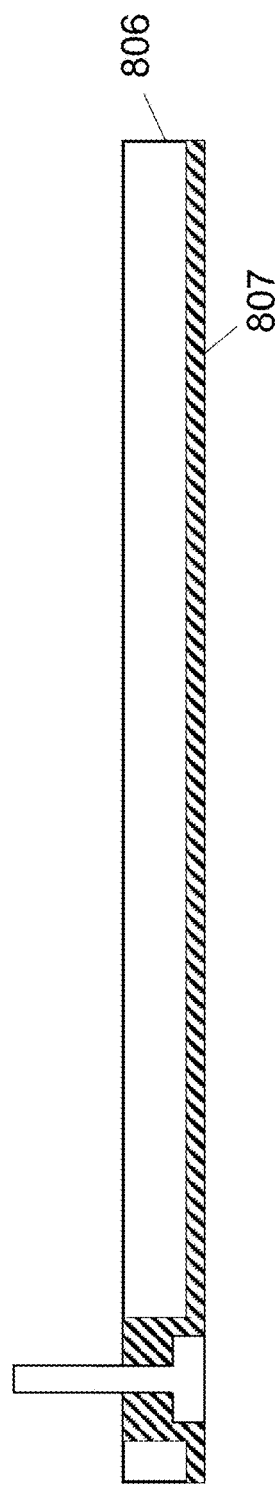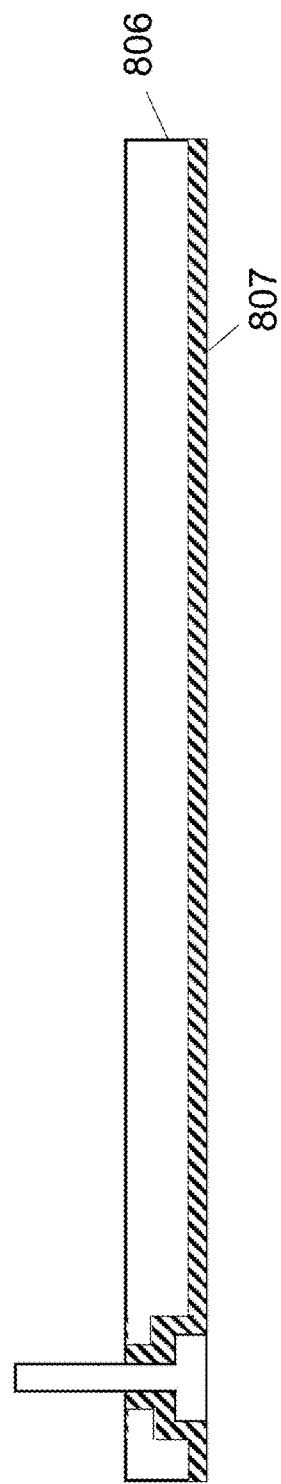

PATTERNED BOLSTER PLATE AND COMPOSITE BACK PLATE FOR SEMICONDUCTOR CHIP LGA PACKAGE AND COOLING ASSEMBLY RETENTION

BACKGROUND

System design engineers face challenges, especially with respect to high performance data center computing, as both computers and networks continue to pack higher and higher levels of performance into smaller and smaller packages. Creative packaging and cooling systems are therefore being designed to keep pace with the thermal requirements of such aggressively designed systems.

FIGURES

Figure 1C:
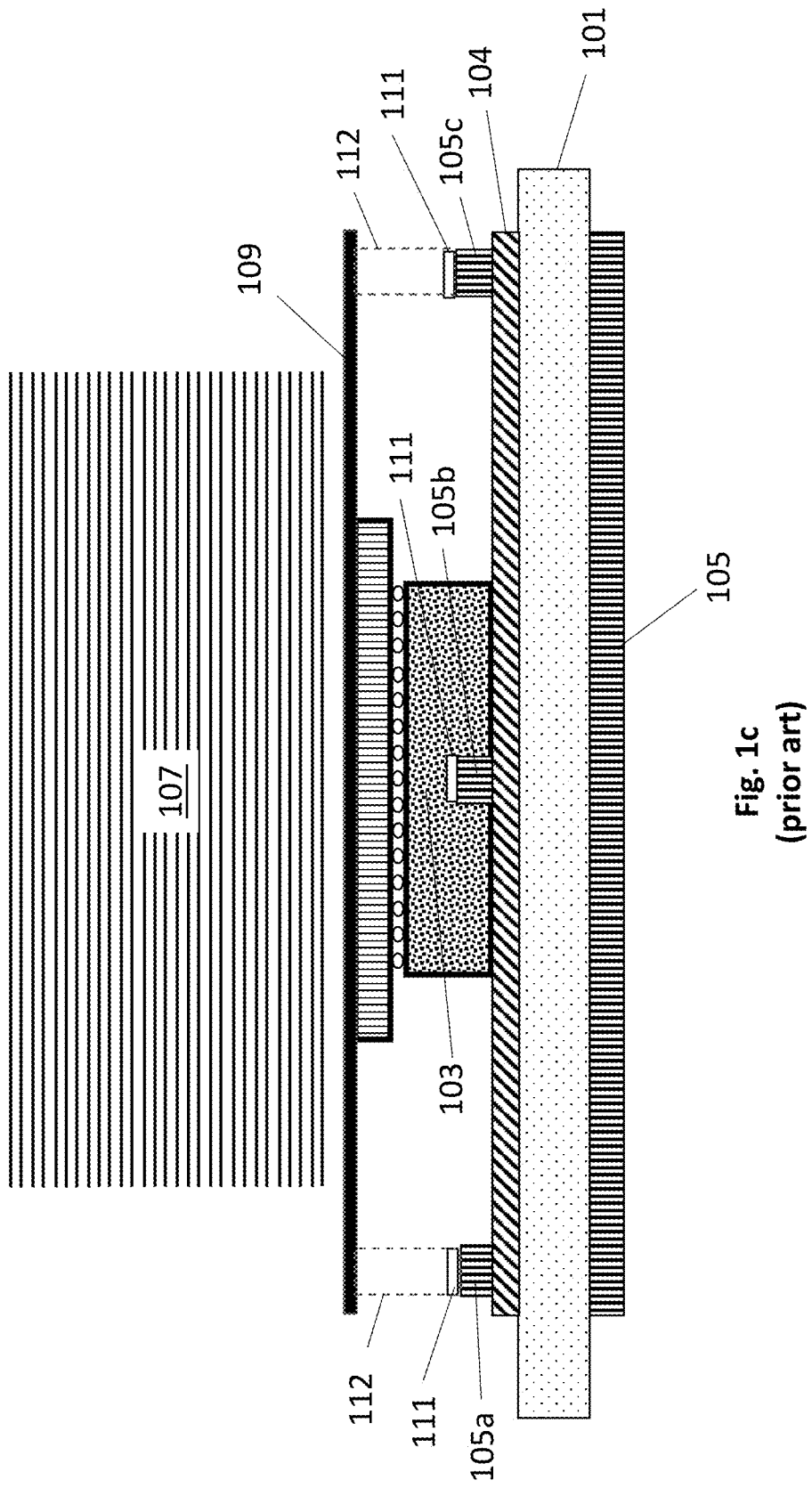
Figure 3B:
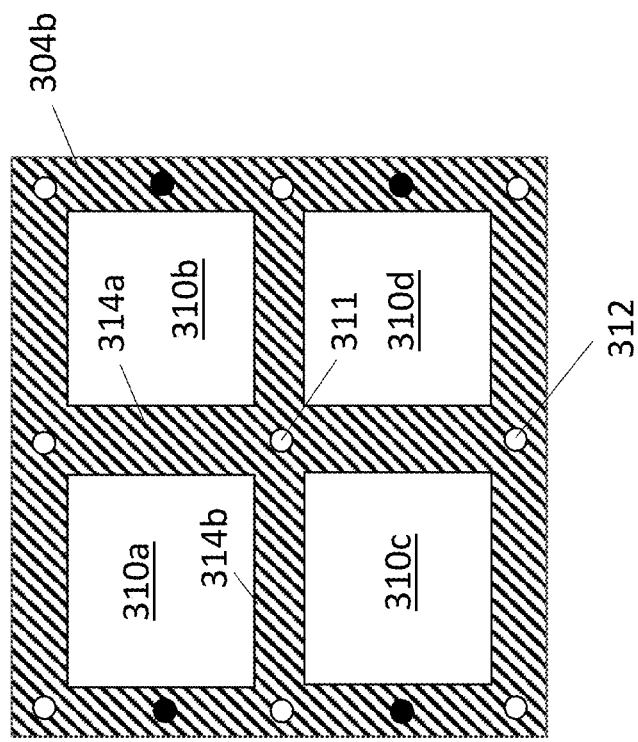
Figure 3A:
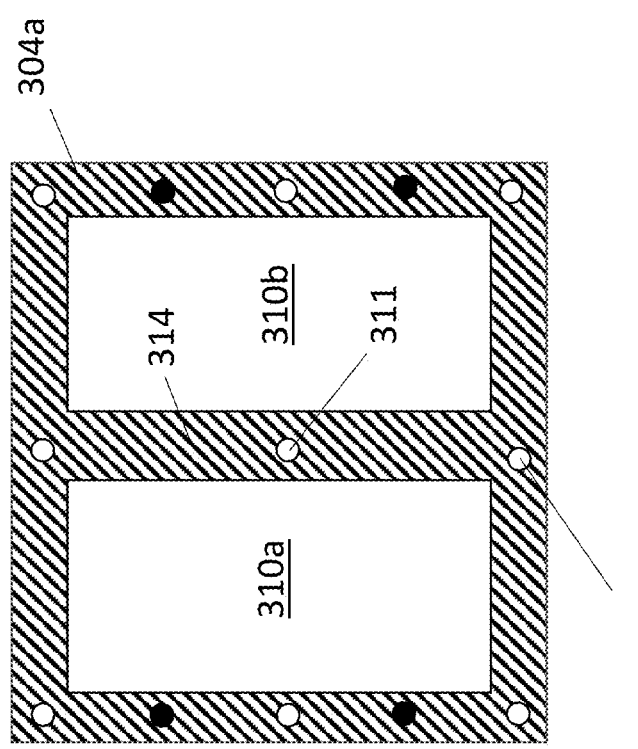
Figure 5C:
Figure 6A:
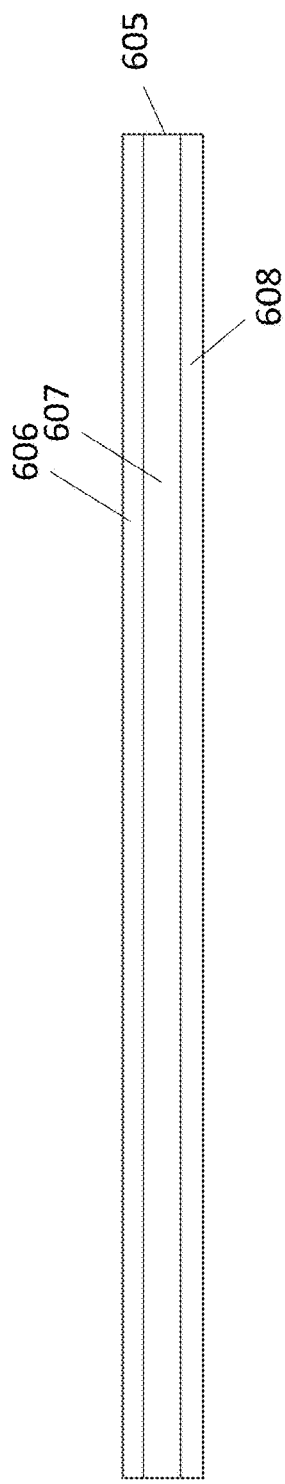
Figure 6B:
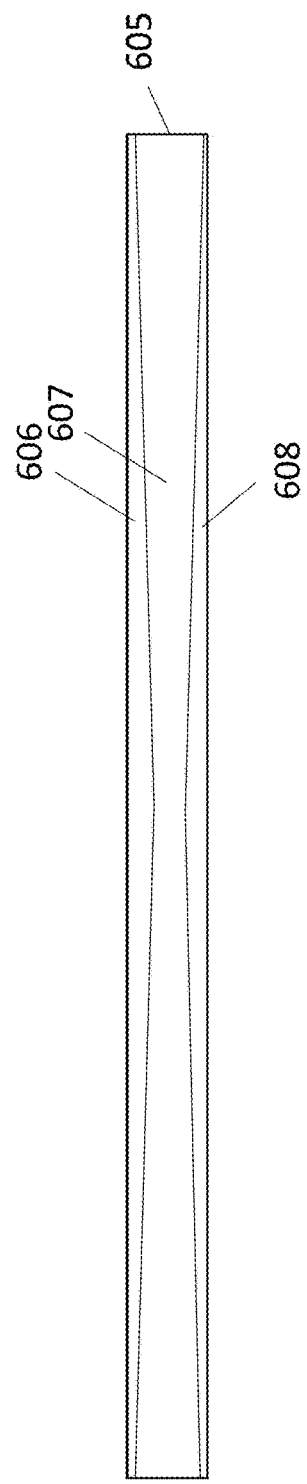
Figure 6C:
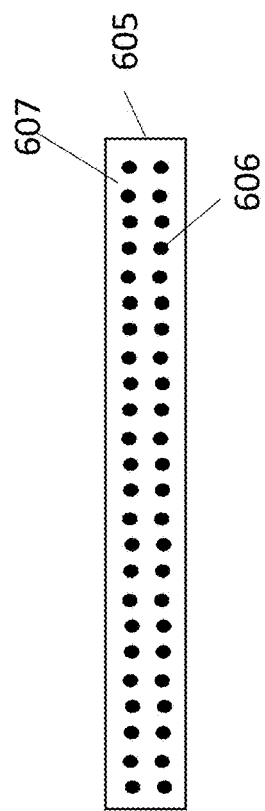
Figure 7:
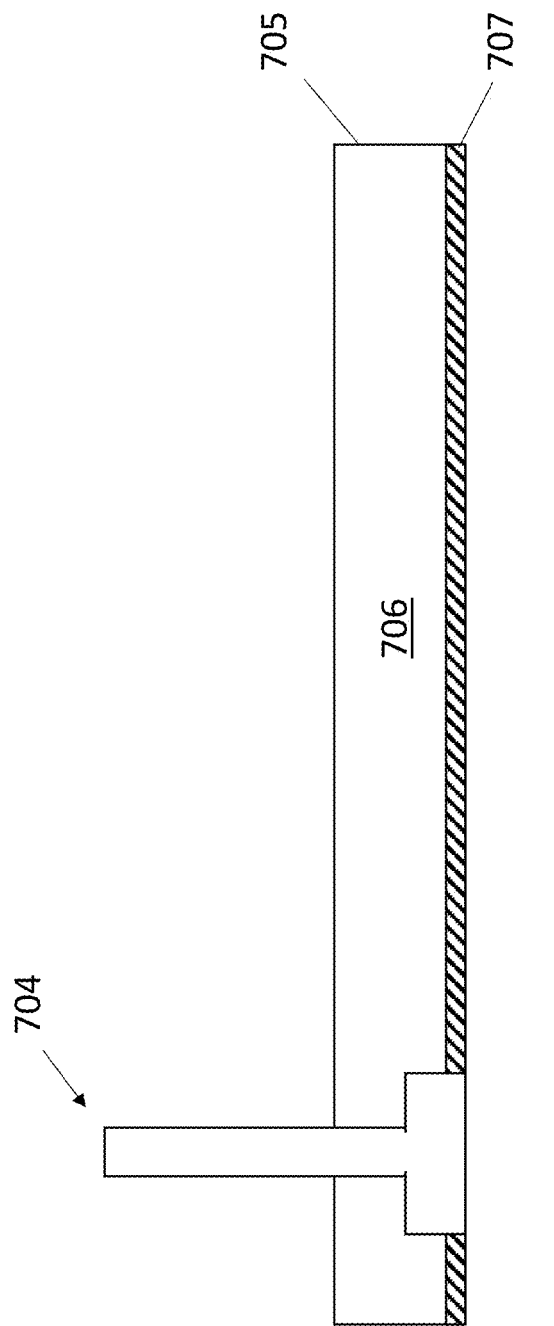
Figure 9:
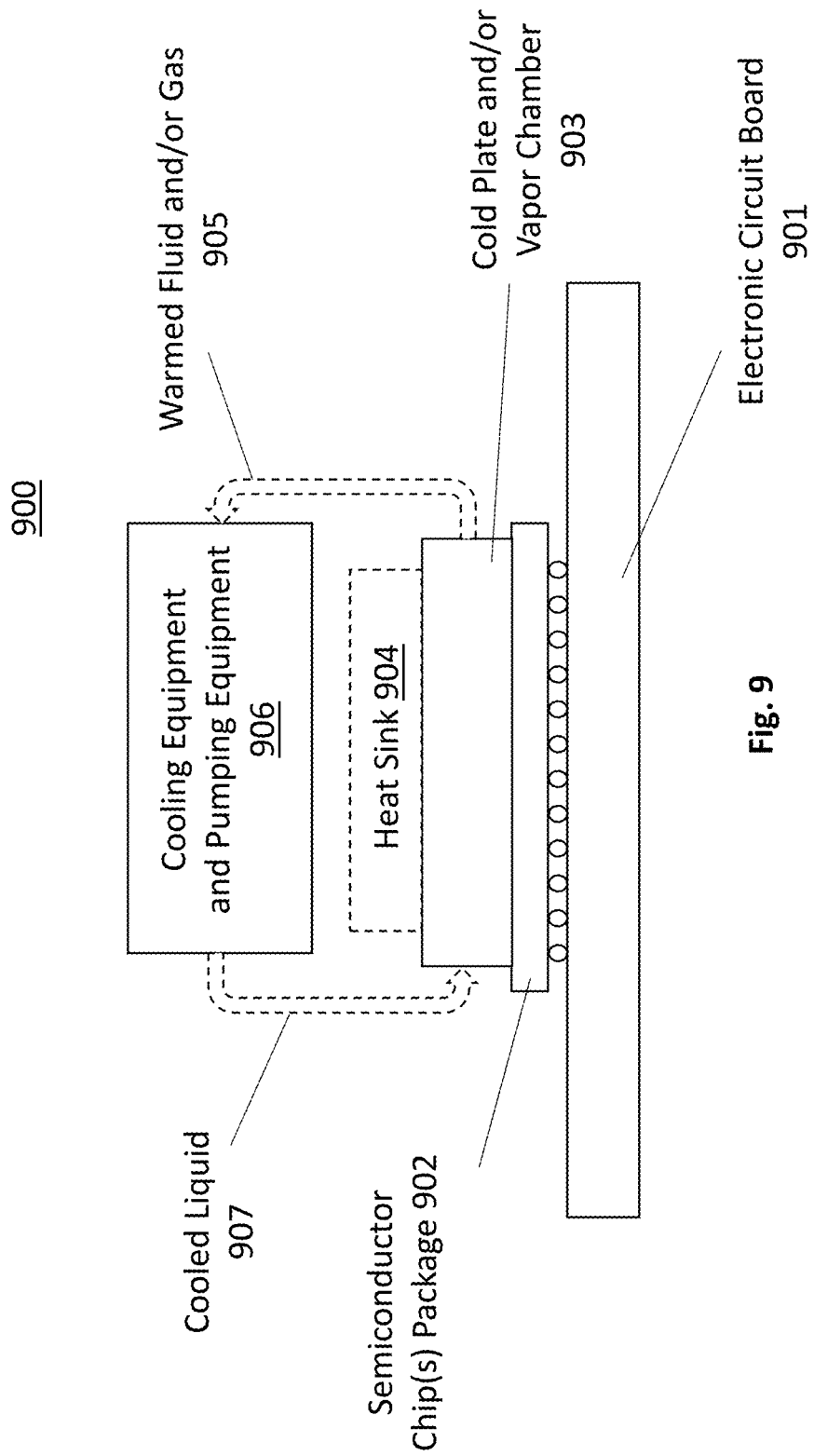
Figure 10:
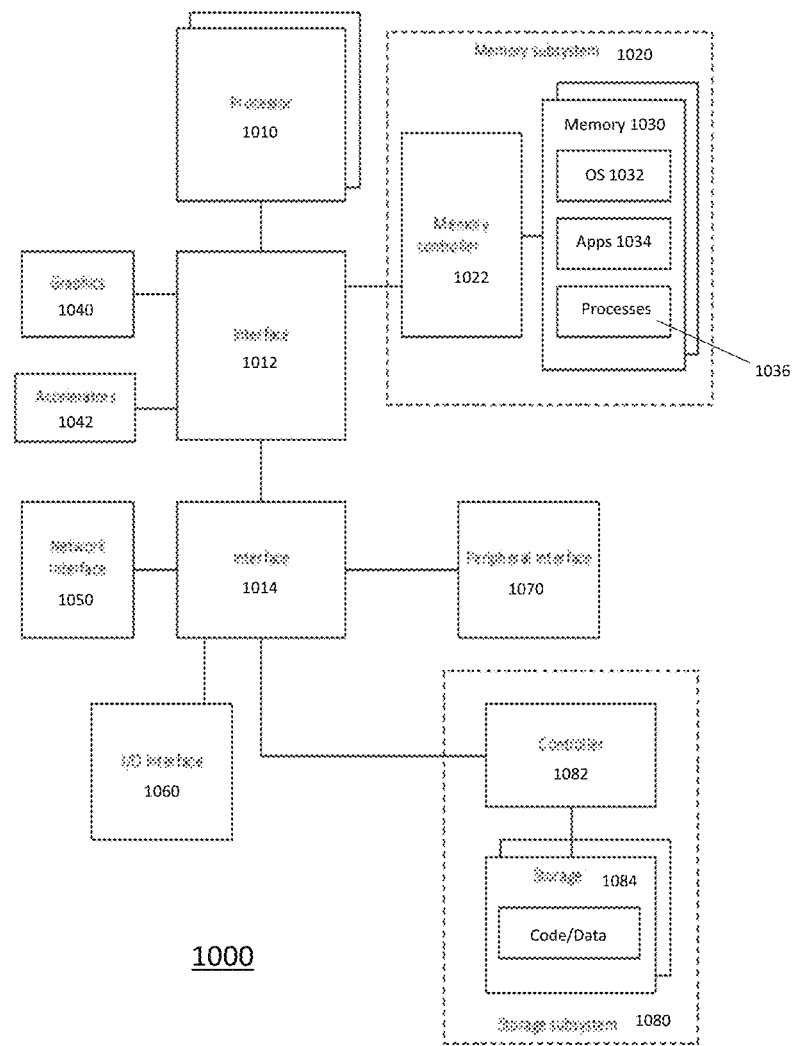
Figure 11:
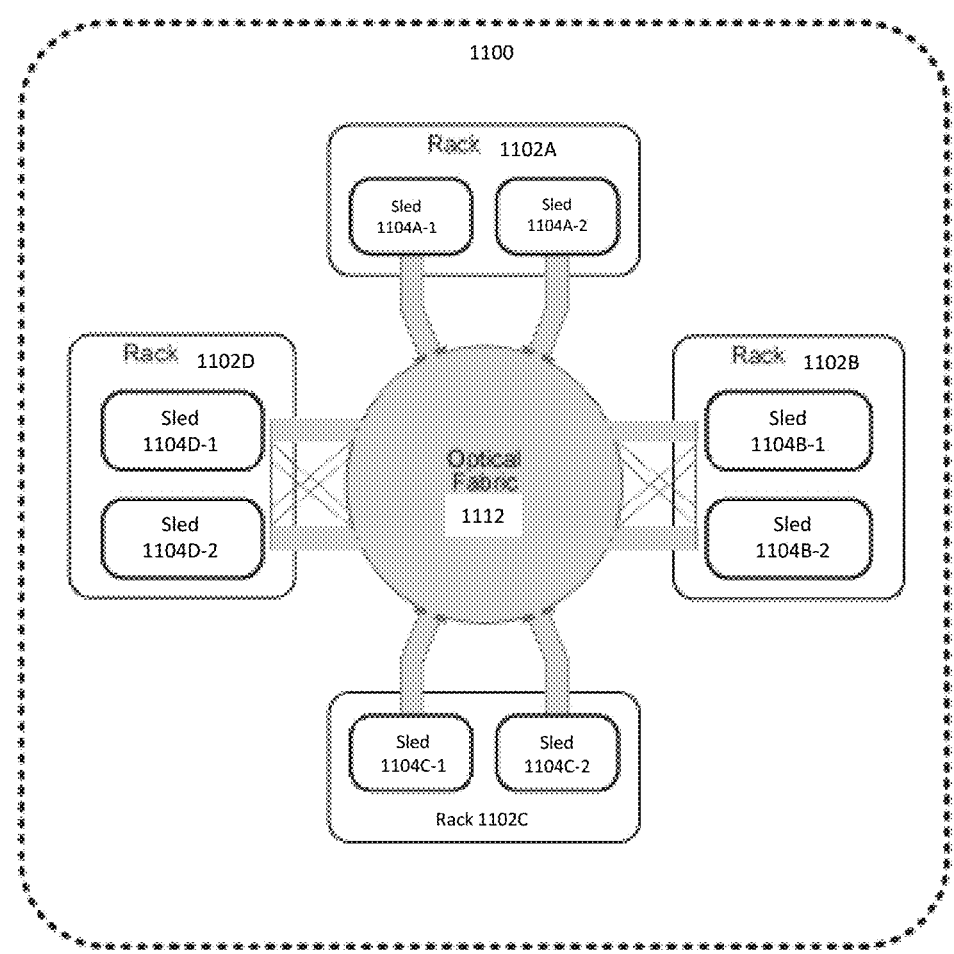
Figure 12:
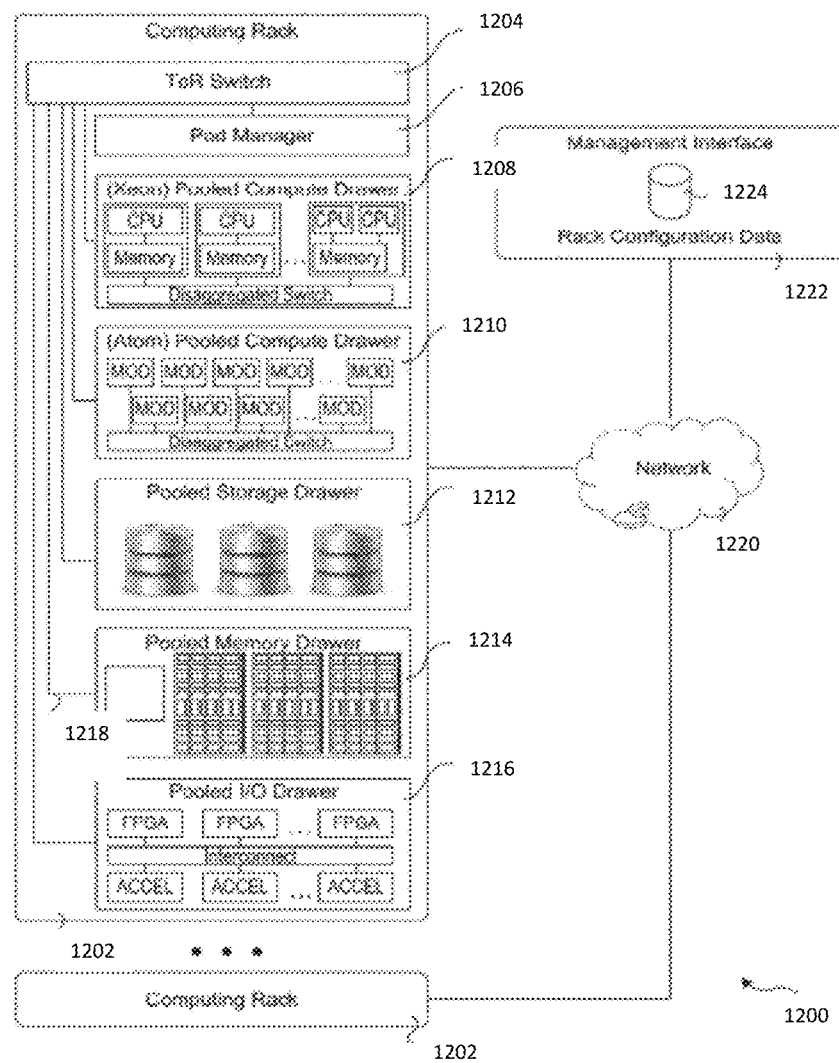

A better understanding of the present invention can be obtained from the following detailed description in conjunction with the following drawings, in which:

FIGS. 1a, 1b and 1c depict a prior art thermal assembly;
FIG. 2 depicts a prior art bolster plate;
FIGS. 3a and 3b depict improved bolster plates;
FIGS. 4a, 4b, 4c, 4d and 4e depict a thermal assembly with an improved bolster plate;
FIGS. 5a, 5b and 5c depict aspects of a thermal assembly with another improved bolster plate;
FIGS. 6a, 6b and 6c depict improved bolster plates;
FIG. 7 shows a prior art studded bolster plate;
FIGS. 8a and 8b show improved studded bolster plates;
FIG. 9 shows a liquid cooling system;
FIG. 10 shows a system;
FIG. 11 shows a data center;
FIG. 12 shows a rack.

DETAILED DESCRIPTION

FIGS. 1a through 1c depict the mounting of a heat sink assembly to a semiconductor chip package. As observed in FIG. 1a, a packaged semiconductor chip 102 (or chips) is connected to a connector 103 that is affixed to an electronic circuit board 101. The bottom face of the chip package 102 has input/outputs (I/Os) (e.g., land grid arrays (LGAs), pins, pads, balls etc.) that electrically and mechanically connect with the connector's corresponding I/Os.

As observed in FIG. 1b, a bolster plate 104 is placed on the chip package side of the electronic circuit board 101 and a back plate 105 is placed on the opposite side of the electronic circuit board 101.

A top down view of the bolster plate 104 is observed in FIG. 2. As can be seen in FIG. 2, the bolster plate 104 is a frame-like structure. The bolster plate is positioned on the printed circuit board 101 such that the connector 103 is within the open space 201 of the bolster plate 104.

Also, referring to FIGS. 1b and 2, the backing plate 105 has studs (e.g., studs 105a, 105b and 105c of FIG. 1b) that are aligned with holes in the bolster plate 104. For ease of drawing, FIG. 2 only labels holes 205a, 205b, 205c which correspond to the holes that backing plate studs 105a, 105b, 105c are respectively inserted through. That is, FIG. 1b is drawn looking at the side of the assembly in the direction of ray 200 of FIG. 2.

Fixturing elements 111 (e.g., screws, bolts, etc.) are then applied to the studs and tightened to rigidly secure the bolster plate 104 to the back plate 105. Here, particularly in the case of a chip package having a large LGA array that exerts considerable push-back (because of the spring-like nature of an LGA), the bolster plate 104 and the back plate 105 should be rigidly secured to prevent bowing of the electronic circuit board 101.

Then, as observed in FIG. 1c, a heat sink 107 having a base 109 is mounted to the bolster plate 104. Referring back to FIG. 2, note that bolster plate 104 has additional mechanical interfacing elements 212 (e.g., studs, mounts, holes, etc.) that are used to mount the heat sink base 109 to the bolster plate 104. Commonly, some kind of spring-loaded attachment hardware 112 is coupled between the bolster plate 104 and the heat sink base 109 to keep the heat sink base 109 in thermal contact with the semiconductor chip package while supporting the weight of the heat sink 107 and base 109 through the bolster plate 104 (notably, attachment hardware 112 is behind studs 105a and 105c and fixturing elements 111 when the assembly is viewed along ray 200).

A problem is that future generations of silicon chip manufacturing technology will drive higher performance semiconductor chips characterized by increased transistor packing densities and corresponding increased amounts of dissipated heat and increased number of I/Os. Unfortunately, the increased dissipated heat combined with the increased number of I/Os creates packaging challenges that are best met through increased loading forces applied to the packaged semiconductor chip and its cooling assembly.

Specifically, increasing the number of I/Os associated with the chip package 102 and connector 103 increases the propensity for the chip package 102 to "pop off" the connector 103, and/or, the connector 103 to "pop off" the printed circuit board 101. The propensity to "pop off" is particularly severe with LGAs which are spring-like and exert pushback. As such, referring to FIG. 2, the open area 201 of the bolster plate 204 becomes larger (to accommodate more I/Os) which makes it more difficult for the bolster plate 104 to hold its shape and protect the electronic circuit board 101 in conjunction with the back plate 105 (the propensity of the bolster plate 104 to warp becomes greater as the open surface area of the bolster plate 104 increases).

FIGS. 3a and 3b therefore show improved bolster plate designs 304a, 304b having one or more inner support arms 314 (FIG. 3a), 314a, 314b (FIG. 3b) to impede deformation of the bolster plate 304 under the loading forces that are expected with future semiconductor chip technologies. Here, as compared to the prior art bolster plate 104 of FIG. 2 (which is essentially just an outer frame), the inner support arm(s) 314, 314a, 314b create smaller open spaces 310a (FIGS. 3a and 3b), 310b (FIG. 3a and 3b), 310c (FIG. 3b), 310d (FIG. 3b), which sets a higher bolster plate deformation threshold (it takes more loading force to deform the legs around a smaller open space than a larger open space).

Although only two designs 304a, 304b are depicted in FIGS. 3a and 3b, it is pertinent to point that other embodiments can exist that form multiple, smaller open spaces as compared to the standard prior art bolster plate design 104 of FIG. 2. For example, rather than approaches where the inner support arms 314, 314a, 314b are purely orthogonal with respect to the legs of the outer/peripheral frame of the bolster plate 304a,b as observed in FIGS. 3a and 3b, other approaches may orient the inner support arms diagonally with the legs of the outer frame and/or with curved shapes and/or with patterns (e.g., triangular, rhombus, etc.).

Also, as described in more detail below, in various embodiments, the inner support arms 314, 314a, 314b include holes 311 to receive back plate studs that can receive a fixture element. By tightening the fixture element, the inner support arms 314, 314a, 314b help to more rigidly secure the bolster plate 304 to the back plate (as compared to the outer frame structure of the prior art bolster plate 104) which impedes any warping or deformation of the bolster plate 314 in response to the loading forces that are applied when the bolster plate 304 is secured to the back plate.

FIGS. 4a through 4e depict a process for forming a cooling assembly with an improved bolster plate as described above. For ease of discussion, FIGS. 4a through 4d assume that the bolster plate 304a of FIG. 3a is being used.

FIG. 4a shows a pair of connector pieces 403a, 403b affixed to the electronic circuit board 401. Then, as observed in FIG. 4b, the bolster plate 404 is placed on the side of the electronic circuit board 401 with the connector pieces 403a, 403b and the back plate 405 is placed on the opposite side of the electronic circuit board 401. Here, the pair of connector pieces 403a, 403b are shaped and positioned to respectively fit within the open spaces 310a, 310b of the bolster plate 304a. Studs that emanate from the back plate 405 push through holes in the bolster plate 404.

For ease of drawing, referring to FIG. 3a and FIG. 4b, the stud that pushes through the hole 312 located midway along the outer frame is not drawn so that the stud 405b that pushes through the hole 311 located midway along the inner support arm 314 of the bolster plate 304a can be seen.

Then, as observed in FIG. 4c, a fixturing elements 411 are tightened to the studs, including stud 405b, to secure the bolster plate 404 to the back plate 405. As will become apparent immediately below, stud 405b and its fixturing element will be located beneath the chip package when the final assembly is complete.

It is pertinent to point out that other bolster plate embodiments can have more than one stud beneath the chip package. For example, in one such embodiment, inner support arm 314 has two holes both of which reside beneath the chip package. In this case, fixturing elements would be applied to the studs that push through both holes and secured prior to mounting of the chip package.

After the fixturing elements 411 are tightened and the bolster plate 404 is secured to the back plate 405, as observed in FIG. 4d, the chip package 402 is mounted to the socket pieces 403a, 403b. As discussed in FIG. 4a, the connector is divided into separate pieces 403a, 403b to make room for the bolster plate's inner support arm 314. Likewise, in order to properly mount to the separate connector pieces 403a, 403b, the I/Os on the underside of the chip package 402 are likewise separated into two separate fields. Thus, unlike the I/Os on the underside of the prior art chip package 102, which are spread across one continuous field, by contrast, there are two separate (partitioned) fields of I/Os on the underside of the chip package 402 of FIG. 4d.

In other embodiments, there are more than two separate I/O fields on the chip package underside because more than two connector pieces exist owing to the design of the bolster plate's which has more than two open spaces. For example, if the bolster plate 404b of FIG. 3b were used, there would be four connector pieces and four separate fields of I/Os on the chip package underside.

After the chip package 402 is mounted, referring to FIG. 4e, the heat sink 407 and heat sink base 409 is mounted to the bolster plate 404 with mechanical interfacing elements 412 (again, mechanical interfacing elements 412 are behind studs 405a, 405b).

FIGS. 5a, 5b and 5c are directed to another embodiment in which the connector 503 is a single piece and the inner support arm 314, 514 of the bolster plate 504 is raised and sits on the connector 503. Here, referring to FIG. 5a, a single connector 503 is fixed to the printed circuit board 501. However, because of the inner support arm 314, 514 of the bolster plate, as with the embodiment described above with respect to FIGS. 4a-e, the connector's I/Os are separated into two separate areas that are aligned with the open spaces in the bolster plate 504.

As observed in FIG. 5b, the bolster plate 504 and the backing plate 505 are placed on opposite sides of the electronic circuit board 501. Studs on the backing plate are pushed through holes in the printed circuit board and bolster plate. Fixturing elements 511 are then tightened to the studs to rigidly secure the bolster plate 504 and back plate 505 together.

Additionally, the inner support arm 514 of the bolster plate 504 is elevated above the plane of the bolster plate's outer frame so that the inner support arm 514 can be placed over the connector 503. That is, referring to FIGS. 5b and 5c, FIG. 5c shows the bolster plate when viewed along ray 500 of FIG. 5b. As can be seen in FIG. 5c, the bolster plate's outer frame 504 resides along a lower plane while the inner support arm 514 resides along a higher plane. As such, there is space beneath the support arm 514 where the connector 503 resides when the bolster plate 504 is placed on the electronic circuit board 501.

Referring to FIG. 5b, a stud 505a that emanates from the backing plate 505 pushes through aligned holes in each of the electronic circuit board 501, connector 503 and inner support arm 314, 514. Fixturing elements 511 are then secured to the studs to secure the bolster plate 504, including inner support arm 514, to the backing plate 505.

Besides (or in combination with) introducing a new bolster plate design, the cooling assembly's ability to handle the loading forces associated with future semiconductor chip technologies can be enhanced by increasing the stiffness of the backing plate. In general, the stiffness of the backing plate can be increased by increasing the thickness of the backing plate. Unfortunately, for common back plate materials (e.g., steel), the thickness needed to achieve the desired stiffness is too large to accommodate high density systems.

For example, according to one perspective, steel back plate thickness is currently at 2.2 mm and would need to increase to 2.5 mm to obtain the desired stiffness. However, there is not enough spacing/tolerance in the mechanical system design to accommodate this increase.

As such, the increase in stiffness can be accomplished by using harder materials such as tungsten, iridium, tungsten alloys (e.g., tungsten rhenium), iridium alloys, etc. Unfortunately, such materials are more exotic and therefore more expensive. Although forming the back plate entirely from such materials would result in a back plate that has acceptable thickness (e.g., 2.2 mm) and stiffness, the cost of the back plate would be problematic.

A solution therefore is depicted in FIG. 6a which shows a multilayer back plate 605 having three different layers 606, 607, 608. The inner layer 607 forms the bulk of the back plate (is thicker than the outer layers) and is composed of cheaper, less hard material (e.g., steel, plastic) that would not provide sufficient hardness if the entire back plate 605 where composed of the material. However, the inner layer 607 does contribute to the stiffness of the back plate 605 and, with the back plate 605 mostly composed of the inner layer material 607, helps lower the cost of the back plate 605.

The outer layers 606, 608 are composed of harder, more expensive material (e.g., tungsten, iridium, an alloy of these (e.g., tungsten rhenium), etc.) and "boost" the stiffness of the back plate 605 beyond that of the inner layer 607 to a level that is satisfactory for the application. Moreover, the outer layers 606, 608 are thinner than the inner layer 607 (e.g., 0.4 mm for each outer layer vs. 1.4 mm for the inner later) to lower the cost of the back plate 605. The total thickness of the back plate (the summation of all three layers) is sufficiently thin for the application (e.g., 2.2 mm=0.4 mm+1.4 mm+0.4 mm). In essence, in various embodiments, just enough outer layer material 606, 608 is included to keep cost and thickness down yet deliver sufficiently high stiffness.

In another approach of FIG. 6a, the inner layer 607 is also composed of a more expensive, harder material (e.g., tungsten rhenium), but its density is structurally reduced (e.g., has a honeycomb structure) to reduce the total amount of expensive material that is used for the inner layer 607.

The approach of FIG. 6a keeps the thicknesses of the three layers 606, 607, 608 uniform across the surface area of the back plate 605. By contrast, the approach of FIG. 6b varies the thicknesses of the layers 606, 607, 608 across the surface area of the back plate 605. In the particular design of FIG. 6b, the inner layer 607 is thinnest and the outer layers 606, 608 are thickest in the middle of the back plate 605.

This approach would be particularly suitable, e.g., with packages having high density LGA I/Os that are spring-like and tend to bow the back plate when loading forces are applied. Here, the thicker outer layers 606, 608 in the middle of the back plate 605 result in non-uniform back plate 605 stiffness across the surface area of the back plate 605 with highest stiffness in the middle of the back plate 605. A higher stiffness in the middle of the back plate than elsewhere can have the effect of neutralizing or offsetting unequal loading forces (e.g., more force toward the back plate middle than the back plate edges) that tend to bow the back plate.

Although FIG. 6b shows a linear change in layer thickness, other embodiments can have a stepped change in layer thickness (e.g., to ease manufacturing) or a curved change in layer thickness (e.g., to more directly offset bowing forces).

FIG. 6c shows another back plate approach where "wires" of stiffer, more expensive material 606 reinforce a back plate 605 that is otherwise composed of softer, less expensive material 607. Here, if the wires extend end to end along one planar axis (one of length or width), the back plate will have higher uniform stiffness along that axis. By contrast, if the wires are shorter and reside only in a particular location (e.g., the middle of the back plate), the back plate will have higher stiffness along the axis in the particular location. If the wires are "woven" so that wires run along both width and length axis, the back plate will have increased stiffness along both axis. The wires can be cut short and located in a particular location to increase that location's stiffness along the axis that the wires run relative to other locations. Conceivably the wire approach of FIG. 6c could be combined with the three layer approaches of FIGS. 6a and 6b (e.g., by providing the reinforcing wires in the inner layer 607).

Any of the above back plate approaches can result in an affordable back plate having a thickness of 2.2 mm and a Young's modulus of at least 300 GPa (whereas a pure steel back plate of same thickness would have a Young's modulus of only 200 GPa).

Any of the back plate embodiments discussed just above can be used with an improved bolster plate as described above having smaller inner spaces formed with additional support bars that receive loading forces to reduce warping.

FIG. 7 shows a prior art back plate approach 705 that the approaches of FIGS. 6a, 6b and 6c improve upon. As observed in FIG. 7, the prior art back plate is a multilayer structure formed of two layers 706, 707. Here, the upper thicker layer 706 is a ceramic (e.g., alumina) and the lower thinner layer 707 is composed of steel. The ceramic 706 has higher stiffness than the steel 707 to increase the overall stiffness of the back plate beyond that of steel.

A stud 704 is also integrated into the back plate. Here, appropriate cavities are formed in the upper and lower layers 706, 707 and the stud (which is a separate piece of steel) is inserted into the cavities and brazed into place.

Unfortunately, under high loading forces it has been observed that structural failures can exist in the cavities of the layers 706, 707. Specifically, the cavity in the upper layer 706 of ceramic material can fracture around the stud 704 under high loading forces. Additionally, the cavity in the lower layer 707 of steel can yield around the stud 704 under high loading forces. The structural failure in the upper layer 706 is a consequence of forces that intensify under high loading because a small cavity is formed in the upper layer 706. The structural failure in the lower layer 707 is a consequence of its thinness.

FIGS. 8a and 8b depict improved stud implementations that eliminate these structural failures. As observed in FIG. 8a, a larger hole cavity is formed in the upper ceramic layer 806. The lower layer of steel 807 is formed with a plug to fill the hole cavity in the upper layer 806. The back side of the plug is machined/milled to form a cavity structure that receives the stud. The stud is inserted into the cavity structure and brazed in place. Alternatively, the stud emanates from the plug as a continuous member of the plug (the stud is not a separate piece).

Regardless, a vertical cylindrical upper/lower layer interface exists that is better able to handle the high loading forces. Here, forces experienced by the upper ceramic layer 806 under high loading are reduced via distribution around the larger cylinder plug (the size of the cavity in the upper layer 806 is larger than in the approach of FIG. 7). Moreover, the mass/thickness of the lower steel layer 807 is increased in the vicinity of the stud because of the plug.

FIG. 8b takes a similar approach to FIG. 8a but the plug is shaped to be more conformal to the shape of the stud.

Notably, any of the teachings provided above with respect to FIGS. 8a and 8b concerning stud/plate integration can be applied to the teachings provided above with respect to FIGS. 6a and 6b concerning multilayer backplanes. That is, cavities can be formed in the upper and middle layers 606, 607 in which a plug formed in the bottom layer 608 is inserted.

Likewise, any of the backplane teachings provided above with respect to FIGS. 6a, 6b and 6c and FIGS. 8a and 8b, or combinations of these, can be implemented to form a back plate for use in a cooling assembly having the improved bolster plate as described above with respect to FIGS. 3a,b through FIGS. 5a,b,c.

Although the teachings above have been directed to traditional air cooling with a heat sink, these same teachings can be applied to liquid cooling approaches as well. FIG. 9 depicts a general cooling apparatus 900 whose features can be found in many different kinds of semiconductor chip cooling systems that employ some form of liquid cooling.

As observed in FIG. 9, one or more semiconductor chips within a package 302 are mounted to an electronic circuit board 901. A cold plate 903 is thermally coupled with the package 902 (e.g., by being placed on the package 902 with a thermally conductive material ("thermal interface material") between them) so that the cold plate 903 receives heat generated by the one or more semiconductor chips (the cold plate 903 can also be referred to as a vapor chamber in the case of two phase cooling systems).

Notably, cold plate 903 can replace the heat sink base 309, 409 and the heat sink 307, 407 in the above described embodiments. In embodiments that employ both a heat sink and a cold plate, the cold plate 903 and a heat sink and heat sink base can be mounted to the bolster plate via mechanical interface elements 312, 412. Here, any of a heat sink, cold plate, vapor chamber, etc. can be referred to as a "mass".

Liquid coolant is within the cold plate 903. If the system also employs air cooling (optional), a heat sink 904 can be thermally coupled to the cold plate 903. Warmed liquid coolant and/or vapor 905 leaves the cold plate 903 to be cooled by one or more items of cooling equipment (e.g., heat exchanger(s), radiator(s), condenser(s), refrigeration unit(s), etc.) and pumped by one or more items of pumping equipment (e.g., dynamic (e.g., centrifugal), positive displacement (e.g., rotary, reciprocating, etc.)) 906. Cooled liquid 907 then enters the cold plate 903 and the process repeats.

With respect to the cooling equipment and pumping equipment 906, cooling activity can precede pumping activity, pumping activity can precede cooling activity, or multiple stages of one or both of pumping and cooling can be intermixed (e.g., in order of flow: a first cooling stage, a first pumping stage, a second cooling stage, a second pumping stage, etc.) and/or other combinations of cooling activity and pumping activity can take place.

Moreover, the intake of any equipment of the cooling equipment and pumping equipment 906 can be supplied by the cold plate of one semiconductor chip package or the respective cold plate(s) of multiple semiconductor chip packages.

In the case of the later (intake received from cold plate(s) of multiple semiconductor chip packages), the semiconductor chip packages can be components on a same electronic circuit board or multiple electronic circuit boards. In the case of the later (multiple electronic circuit boards), the multiple electronic circuit boards can be components of a same electronic system (e.g., different boards in a same server computer) or different electronic systems (e.g., electronic circuit boards from different server computers). In essence, the general depiction of FIG. 9 describes compact cooling systems (e.g., a cooling system contained within a single electronic system), expansive cooling systems (e.g., cooling systems that cool the components of any of a rack, multiple racks, a data center, etc.) and cooling systems in between.

In other approaches, the liquid based cooling is entirely self contained by the package's thermal assembly. For example, the vapor chamber of a two-phase cooling assembly may sit on top of the package. When the liquid inside the vapor chamber boils vapor expands upward, e.g., within tubes that are embedded in a heat sink. The vapor then cools back into a liquid and falls back into the vapor chamber. In this case no cooling or pumping equipment 906 exists (the cooling system is self contained in the package's assembly.

FIG. 9 also describes immersion cooling systems where it is understood that the warmed fluid and/or vapor flow 905 is from the immersion bath chamber (not shown for illustrative ease) and the cooled fluid flow is 907 is into the immersion bath chamber.

To the extent any of the above described liquid based cooling approaches integrate a large mass on the semiconductor chip package (e.g., a cold plate or vapor chamber with or without a heat sink thereon) and the large mass drives high loading forces when securing the cooling apparatus to the chip package, any of the teachings above can be applied to the corresponding cooling assembly (e.g., a bolster plate that supports a cold plate or vapor chamber having smaller open spaces, a composite backing plate, etc.).

The following discussion concerning FIGS. 10, 11 and 12 are directed to systems, data centers and rack implementations, generally. It is pertinent to point out that any packaged electronic component and/or electro-optic component on any electronic circuit board of any of the systems, data centers and rack implementations described below can be mounted with hardware according to the teachings discussed at length just above.

FIG. 10 depicts an example system. System 1000 includes processor 1010, which provides processing, operation management, and execution of instructions for system 1000. Processor 1010 can include any type of microprocessor, central processing unit (CPU), graphics processing unit (GPU), processing core, or other processing hardware to provide processing for system 1000, or a combination of processors. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Certain systems also perform networking functions (e.g., packet header processing functions such as, to name a few, next nodal hop lookup, priority/flow lookup with corresponding queue entry, etc.), as a side function, or, as a point of emphasis (e.g., a networking switch or router). Such systems can include one or more network processors to perform such networking functions (e.g., in a pipelined fashion or otherwise).

In one example, system 1000 includes interface 1012 coupled to processor 1010, which can represent a higher speed interface or a high throughput interface for system components that needs higher bandwidth connections, such as memory subsystem 1020 or graphics interface components 1040, or accelerators 1042. Interface 1012 represents an interface circuit, which can be a standalone component or integrated onto a processor die. Where present, graphics interface 1040 interfaces to graphics components for providing a visual display to a user of system 1000. In one example, graphics interface 1040 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 1040 generates a display based on data stored in memory 1030 or based on operations executed by processor 1010 or both. In one example, graphics interface 1040 generates a display based on data stored in memory 1030 or based on operations executed by processor 1010 or both.

Accelerators 1042 can be a fixed function offload engine that can be accessed or used by a processor 1010. For example, an accelerator among accelerators 1042 can provide compression (DC) capability, cryptography services such as public key encryption (PKE), cipher, hash/authentication capabilities, decryption, or other capabilities or services. In some embodiments, in addition or alternatively, an accelerator among accelerators 1042 provides field select controller capabilities as described herein. In some cases, accelerators 1042 can be integrated into a CPU socket (e.g., a connector to a motherboard or circuit board that includes a CPU and provides an electrical interface with the CPU). For example, accelerators 1042 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 1042 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 1020 represents the main memory of system 1000 and provides storage for code to be executed by processor 1010, or data values to be used in executing a routine. Memory subsystem 1020 can include one or more memory devices 1030 such as read-only memory (ROM), flash memory, volatile memory, or a combination of such devices. Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide software logic to provide functions for system 1000. In one example, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory includes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 1000 includes interface 1014, which can be coupled to interface 1012. In one example, interface 1014 represents an interface circuit, which can include standalone components and integrated circuitry. In one example, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, cellular network interconnection components, USB (universal serial bus), or other wired or wireless standards-based or proprietary interfaces. Network interface 1050 can transmit data to a remote device, which can include sending data stored in memory. Network interface 1050 can receive data from a remote device, which can include storing received data into memory. Various embodiments can be used in connection with network interface 1050, processor 1010, and memory subsystem 1020.

In one example, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one example, system 1000 includes storage subsystem 1080 to store data in a nonvolatile manner. In one example, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, or optical based disks, or a combination. Storage 1084 holds code or instructions and data in a persistent state (e.g., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (e.g., the value or state of the data is indeterminate if power is interrupted to system 1000). In one example, storage subsystem 1080 includes controller 1082 to interface with storage 1084. In one example controller 1082 is a physical part of interface 1014 or processor 1010 or can include circuits or logic in both processor 1010 and interface 1014.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 1000. More specifically, power source typically interfaces to one or multiple power supplies in system 1000 to provide power to the components of system 1000. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 1000 can be implemented as a disaggregated computing system. For example, the system 1000 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

FIG. 11 depicts an example of a data center. Various embodiments can be used in or with the data center of FIG. 11. As shown in FIG. 11, data center 1100 may include an optical fabric 1112. Optical fabric 1112 may generally include a combination of optical signaling media (such as optical cabling) and optical switching infrastructure via which any particular sled in data center 1100 can send signals to (and receive signals from) the other sleds in data center 1100. However, optical, wireless, and/or electrical signals can be transmitted using fabric 1112. The signaling connectivity that optical fabric 1112 provides to any given sled may include connectivity both to other sleds in a same rack and sleds in other racks.

Data center 1100 includes four racks 1102A to 1102D and racks 1102A to 1102D house respective pairs of sleds 1104A-1 and 1104A-2, 1104B-1 and 1104B-2, 1104C-1 and 1104C-2, and 1104D-1 and 1104D-2. Thus, in this example, data center 1100 includes a total of eight sleds. Optical fabric 1112 can provide sled signaling connectivity with one or more of the seven other sleds. For example, via optical fabric 1112, sled 1104A-1 in rack 1102A may possess signaling connectivity with sled 1104A-2 in rack 1102A, as well as the six other sleds 1104B-1, 1104B-2, 1104C-1, 1104C-2, 1104D-1, and 1104D-2 that are distributed among the other racks 1102B, 1102C, and 1102D of data center 1100. The embodiments are not limited to this example. For example, fabric 1112 can provide optical and/or electrical signaling.

FIG. 12 depicts an environment 1200 that includes multiple computing racks 1202, each including a Top of Rack (ToR) switch 1204, a pod manager 1206, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 1208, and INTEL® ATOM™ pooled compute drawer 1210, a pooled storage drawer 1212, a pooled memory drawer 1214, and a pooled I/O drawer 1216. Each of the pooled system drawers is connected to ToR switch 1204 via a high-speed link 1218, such as a 40 Gigabit/second (Gb/s) or 100 Gb/s Ethernet link or an 100+ Gb/s Silicon Photonics (SiPh) optical link. In one embodiment high-speed link 1218 comprises an 600 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 1200 may be interconnected via their ToR switches 1204 (e.g., to a pod-level switch or data center switch), as illustrated by connections to a network 1220. In some embodiments, groups of computing racks 1202 are managed as separate pods via pod manager(s) 1206. In one embodiment, a single pod manager is used to manage all of the racks in the pod. Alternatively, distributed pod managers may be used for pod management operations. RSD environment 1200 further includes a management interface 1222 that is used to manage various aspects of the RSD environment. This includes managing rack configuration, with corresponding parameters stored as rack configuration data 1224.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
a bolster plate to be placed between a mass and an electronic circuit board, the mass to be placed in thermal contact with a semiconductor chip package, the semiconductor chip package to be placed within an outer frame of the bolster plate, the bolster plate having one or more inner support arms within the outer frame to form reduced openings in the bolster plate that are smaller than an area within the outer frame, at least a portion of the one or more inner support arms to reside between the semiconductor chip package and the electronic circuit board, the one or more inner support arms having one or more holes in which one or more studs from a back plate are to be inserted, the electronic circuit board to be placed between the bolster plate and the back plate.

2. The apparatus of claim 1 wherein the one or more inner support arms comprise a support arm that is orthogonal to first and second legs of the outer frame and parallel to third and fourth legs of the outer frame.

3. The apparatus of claim 1 wherein there are two reduced openings.

4. The apparatus of claim 1 wherein there are four reduced openings.

5. The apparatus of claim 1 wherein more than one connector is to be placed in the reduced openings between the semiconductor chip package and the electronic circuit board.

6. The apparatus of claim 1 wherein a single connector is to be placed between the semiconductor chip package and the electronic circuit board, wherein, a portion of the single connector is to reside between the at least a portion of the one or more inner support arms and the electronic circuit board.

7. The apparatus of claim 1 wherein one or more respective fixturing elements are to be secured to the one or more studs between the semiconductor chip package and the electronic circuit board.

8. A data center, comprising:
a plurality of racks;
a plurality of computer systems within the plurality of racks;
one or more networks that communicatively couple the plurality of computer systems;
an electronic circuit board within one of the computer systems;
a semiconductor chip package mounted to the electronic circuit board;
a back plate, the electronic circuit board between the back plate and the semiconductor chip package; and,
a bolster plate between a mass and the electronic circuit board, the mass in thermal contact with the semiconductor chip package, the semiconductor chip package within an outer frame of the bolster plate, the bolster plate having one or more inner support arms within the outer frame that form reduced openings in the bolster plate that are smaller than an area within the outer frame, at least a portion of the one or more inner support arms residing between the semiconductor chip package and the electronic circuit board, the one or more inner support arms having one or more holes in which one or more studs from the back plate are inserted.

9. The data center of claim 8 wherein the back plate comprises a first material and a second material, the first material having greater stiffness than the second material, the back plate further comprising at least one of:
a third material having greater stiffness than the second material;
re-enforcement wires composed of the first material; and
a plug composed of the second material that is inserted into a first cavity in the first material, a stud of the one or more studs inserted into a second cavity in the plug.

10. The data center of claim 8 wherein the one or more inner support arms comprise a support arm that is orthogonal to first and second legs of the outer frame and parallel to third and fourth legs of the outer frame.

11. The data center of claim 8 wherein there are two reduced openings.

12. The data center of claim 8 wherein there are four reduced openings.

13. The data center of claim 8 wherein more than one connector is placed in the reduced openings between the semiconductor chip package and the electronic circuit board.

14. The data center of claim 8 further comprising one or more respective fixturing elements secured to the one or more studs between the semiconductor chip package and the electronic circuit board.

* * * * *